(12) United States Patent
Feudel et al.

(10) Patent No.: US 6,924,216 B2
(45) Date of Patent: Aug. 2, 2005

(54) SEMICONDUCTOR DEVICE HAVING IMPROVED DOPING PROFILES AND METHOD OF IMPROVING THE DOPING PROFILES OF A SEMICONDUCTOR DEVICE

(75) Inventors: Thomas Feudel, Radebeul (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/440,640

(22) Filed: May 19, 2003

(65) Prior Publication Data

US 2004/0087120 A1 May 6, 2004

(30) Foreign Application Priority Data

Oct. 31, 2002 (DE) ......................... 102 50 888

(51) Int. Cl.[7] ........................................... H01L 21/425
(52) U.S. Cl. ........................ 438/525; 438/96; 438/97; 438/365; 438/369; 438/373; 438/480; 438/486; 438/514; 438/527; 257/52; 257/63; 257/64; 257/538
(58) Field of Search .................... 438/525, 96–97, 438/365–69, 370–76, 480–81, 486–89, 514–19, 526–32; 257/52, 63–65, 538

(56) References Cited

U.S. PATENT DOCUMENTS

| | | | | |
|---|---|---|---|---|
| 4,144,100 A | * | 3/1979 | MacIver et al. ............. 438/528 |
| 4,753,895 A | * | 6/1988 | Mayer et al. ................ 438/154 |
| 5,420,049 A | * | 5/1995 | Russell et al. ................ 438/22 |
| 5,439,831 A | * | 8/1995 | Schwalke et al. ............ 438/305 |
| 5,717,238 A | * | 2/1998 | Aronowitz et al. ......... 257/336 |
| 5,885,886 A | | 3/1999 | Lee ............................. 438/528 |
| 5,940,711 A | * | 8/1999 | Zambrano ................... 438/366 |
| 6,184,097 B1 | * | 2/2001 | Yu ............................... 438/299 |
| 6,187,620 B1 | * | 2/2001 | Fulford et al. .............. 438/230 |
| 6,200,869 B1 | * | 3/2001 | Yu et al. ...................... 438/301 |
| 6,200,883 B1 | * | 3/2001 | Taylor et al. ................ 438/514 |
| 6,222,253 B1 | * | 4/2001 | Sadana et al. .............. 257/617 |
| 6,258,680 B1 | * | 7/2001 | Fulford, Jr. et al. ........ 438/305 |
| 6,268,640 B1 | * | 7/2001 | Park et al. ................... 257/607 |
| 6,297,082 B1 | * | 10/2001 | Lin et al. ..................... 438/217 |
| 6,342,418 B1 | * | 1/2002 | Murakami et al. .......... 438/241 |
| 6,362,063 B1 | | 3/2002 | Maszara et al. ............ 438/307 |
| 6,368,947 B1 | * | 4/2002 | Yu ............................... 438/530 |
| 6,380,044 B1 | | 4/2002 | Talwar et al. ............... 438/308 |
| 6,391,731 B1 | * | 5/2002 | Chong et al. ............... 438/303 |
| 6,482,724 B1 | * | 11/2002 | Chatterjee ................... 438/525 |
| 6,548,361 B1 | * | 4/2003 | En et al. ..................... 438/301 |
| 6,624,014 B2 | * | 9/2003 | Hsien ......................... 438/199 |
| 6,632,728 B2 | * | 10/2003 | Gossmann et al. ......... 438/527 |
| 6,682,980 B2 | * | 1/2004 | Chidambaram et al. .... 438/302 |
| 6,703,281 B1 | * | 3/2004 | Yu ............................... 438/303 |
| 6,720,632 B2 | * | 4/2004 | Noda .......................... 257/408 |
| 2002/0056874 A1 | * | 5/2002 | Ohtake et al. .............. 257/336 |
| 2002/0113294 A1 | * | 8/2002 | Rhee et al. ................. 257/616 |
| 2004/0087121 A1 | * | 5/2004 | Kammler et al. ........... 438/528 |
| 2004/0137687 A1 | * | 7/2004 | Feudel et al. ............... 438/302 |

OTHER PUBLICATIONS

Graoui et al. "TCAD modeling and experimental investigations of indium for advanced CMOS tech." 0–7803–7155–0/02 2002 IEEE.*

* cited by examiner

Primary Examiner—Matthew Smith
Assistant Examiner—Granvill D. Lee, Jr.
(74) Attorney, Agent, or Firm—Williams, Morgan & Amerson, P.C.

(57) ABSTRACT

A method of forming the active regions of field effect transistors is proposed. According to the proposed method, shallow implanting profiles for both the halo structures and the source and drain regions can be obtained by carrying out a two-step damaging and amorphizing implantation process. During a first step, the substrate is damaged during a first light ion implantation step and subsequently substantially fully amorphized during a second heavy ion implantation step.

55 Claims, 3 Drawing Sheets

SEMICONDUCTOR DEVICE HAVING IMPROVED DOPING PROFILES AND METHOD OF IMPROVING THE DOPING PROFILES OF A SEMICONDUCTOR DEVICE

BACKGROUND OF THE INVENTION

1. Field of the Invention

The present invention relates to the fabrication of integrated circuits, and, more particularly, to the implanting of ions of dopant materials into workpieces and/or substrates suitable for the fabrication of integrated circuits. More specifically, the present invention relates to a method of forming shallow "halo" structures of field effect transistors.

2. Description of the Related Art

In the last several years, the number of circuit elements manufactured on semiconductor substrates has continuously grown. For example, in modem integrated circuit devices, there may be approximately one billion elements per chip due to the continuing miniaturization of feature sizes.

Presently, circuit elements are commonly fabricated featuring minimal sizes of less than 0.18 μm and the progress in manufacturing technology seems likely to continue on in this manner. However, in the particular case of field effect transistors, with the increasing miniaturization of the transistors, it became apparent that MOSFETs exhibit short-channel effects not predicted by the standard MOSFET models. Such short-channel effects comprise, among others, sub-surface punch-through in NMOSFETs and punch-through in PMOSFETs.

Great efforts have been made and several measures have been taken to prevent short-channel MOSFETs from entering the punch-through regime. Among these measures, implanting dopants under the source/drain extension (SDE) regions has proved to be the most reliable and has, therefore, become the most likely used technique for preventing punch-through behavior in field effect transistors. Such implants have been termed "halo" implants.

However, in view of the reduced lateral dimensions of the transistors, the doping profiles of "halo" implants have to also be restricted to shallower locations, that is, "halo" implantations need to be confined within shallow regions close to the surface of the substrate on which the transistors have to be formed. To obtain the shallow halo doping profiles required for source/drain extensions and channels, all physical mechanisms allowing dopants to penetrate deeper into silicon must be strictly controlled or eliminated. In particular, the principal factor to be controlled is ion channeling. To accomplish this end, shallow profile halo doping processes often used a so-called "pre-amorphization" implantation step before the actual halo dopant implantation. In particular, an amorphous zone is usually formed during a first single pre-amorphization implantation and, during a subsequent implantation process (comprising either a single step or a plurality of steps), the doped regions (halo and source/drain extension regions) are formed. Normally, heavy inert ions like germanium or xenon are implanted at an implant energy of approximately 80–200 keV to fully amorphize the surface region of the substrate.

In the following, a description will be given with reference to FIGS. 1a–1d of a typical prior art process for forming the active regions of a field effect transistor, including a typical "pre-amorphization" implanting step as well as a typical "halo" implanting step.

FIG. 1a schematically shows a MOS transistor 100 to be formed on a substrate 1, such as a silicon wafer. Isolation structures 2 define an active region of the transistor 100. Moreover, reference 3 relates to a polysilicon gate electrode of the MOS transistor 100. Reference 6 denotes a gate insulation layer. Reference 7a relates to an ion beam to which the substrate 1 is exposed during a "pre-amorphization" implanting process, and reference 5a relates to amorphous regions formed into the substrate 1.

In FIGS. 1b–1d, those parts already described with reference to FIG. 1a are identified by the same reference numerals. In addition, in FIG. 1b, reference 7e relates to an ion beam to which the substrate 1 is exposed for forming the source/drain extension regions of the transistor 100. Moreover, references 5'S and 5'D relate to the source/extension region and the drain extension region, respectively, of the transistor 100.

FIG. 1c shows the MOS transistor 100 once halo regions 5h have been formed during a prior art halo implantation step. In particular, in FIG. 1c, references 7ha and 7hb relate to corresponding angled ion beams to which the substrate 1 is exposed for forming the halo regions 5h. The dopant material implanted during such a process is of the same type as the dopant used in doping the substrate. That is, the halo implants for NMOS and PMOS devices are performed using a P-type and an N-type dopant material, respectively. In a sense, the halo implants reinforce the dopants in the substrate.

In FIG. 1d, reference 4 relates to dielectric sidewall spacers formed on the sidewalls of the polysilicon line 3 and references 5S and 5D relate to the source and drain regions, respectively, after a further heavy implantation step has been carried out for determining the final concentration of dopants in the source and drain regions.

A typical process flow for forming the active regions of the transistor 100 comprising the amorphous regions 5a, the halo structures 5h, and the source and drain regions 5S and 5D may include the following steps.

Following the formation of the gate insulation layer 6 and the overlying polysilicon line 3 according to well-known lithography and etching techniques, the amorphous regions 5 are formed during a first step (see FIG. 1a) with a single pre-amorphization implantation. To this end, the substrate 1 is exposed to the ion beam 7a and heavy ions such as, for example, phosphorous, arsenic and argon are implanted into the substrate at an implanting energy of about 18 keV.

It has been observed that at a predefined implanting dose, local amorphous regions are created by the ions penetrating into the substrate, which eventually overlap as the implanting process is carried out until a continuous amorphous layer is formed.

This amorphous layer is formed with the purpose of controlling ion channeling during the next implanting steps so as to obtain shallow implanting profiles for both the halo regions and the source and drain regions to be formed in the substrate. That is, the implanted ions do not penetrate in an amorphous layer as deeply as in a crystalline layer so that the implanted ions can be confined to shallower regions and the actual doping profile and final dopant concentration of those regions implanted after the pre-amorphization implantation step can be better controlled.

In a next step, as depicted in FIG. 1b, a second ion implantation step is carried out to form the source/drain extension regions 5'S and 5'D. To this end, by exposing the substrate 1 to the ion beam 7e, a dose of approximately $3 \times 10^{13} - 3 \times 10^{14}$ cm$^{-2}$ dopant ions is implanted at low energy (30–50 keV). The implantation process causes the edges of these implanted regions to be substantially aligned with the edge of the gate, i.e., this is a self-aligned process. The second ion implantation step is performed with N-type and P-type dopant materials for NMOS and PMOS devices, respectively.

The halo regions 5h of the transistor 100 are then formed during a subsequent step, as depicted in FIG. 1c. In particular, a further ion implantation step is carried out during which the substrate 1 is exposed to the ion beams 7ha and 7hb. This halo implant is also self-aligned with the channel edges and dopants are placed beneath those dopants implanted into the SDE regions and at a depth which is less than the depth of the amorphous regions 5a. As depicted in FIG. 1c, during halo implants, the ion beams 7ha and 7hb are kept at a tilt angle of approximately 30 degrees with respect to the surface of the substrate 1. In particular, the implanting step is divided into two parts. During the first part, the substrate 1 is exposed to the ion beam 7ha and a dose corresponding to one-half of the final dose is implanted. Once the first part is completed, the substrate is rotated 180 degrees about an axis perpendicular to the surface of the substrate and again exposed to the ion beam 7hb. In FIG. 1c, two ion beams 7ha and 7hb have been depicted for clarity reasons. However, during the second part of the implanting process, the ion beam 7hb corresponds to the ion beam 7ha during the first part, with the only difference being that the substrate 1 is rotated 180 degrees once the first part of an implanting step is completed. The dopant concentration in the regions 5h, as well as the implant energy and the dopants, are selected depending on the type of transistor to be formed on the substrate 1. For instance, boron ions in NMOS and phosphorous in PMOS are implanted to form a halo punch-through suppression region in each device. Usually, phosphorous is implanted at 90 keV with a dose of $2 \times 10^{13}$ cm$^{-2}$ at 25 degrees tilt, in two segments, with the substrate rotated 180 degrees between the two segments. Similar procedures are used for implanting boron. A thermal treatment, such as an annealing step, is usually performed after the ion implantation step for diffusing dopants into the substrate.

During a subsequent step, the source and drain regions 5S and 5D of the transistor 100 are completed, as depicted in FIG. 1d. In particular, dielectric sidewall spacers 4 are formed on the sidewalls of the polysilicon line 3 according to well-known techniques, and a further heavy implantation step is carried out for implanting dopants into those regions of the substrate not covered by the polysilicon line and the sidewall spacers 4. At the end of the heavy implantation step, the source and drain regions 5S and 5D are formed to exhibit the desired dopant concentration. For NMOS and PMOS type devices, this heavy implantation step is performed using an N-type and a P-type dopant material, respectively. The manufacturing process is then continued to complete the transistor 100 according to techniques well known to those skilled in the art.

As stated above, the pre-amorphization implanting process as depicted in FIG. 1a is performed for the purpose of controlling the ion channeling during the subsequent implanting steps so as to obtain doping profiles for both the halo structures and the source and drain regions that are as shallow as required in view of the reduced lateral dimensions of the modern transistors. That is, by pre-amorphizing the substrate, the dopants implanted into the substrate during subsequent implanting processes are confined to shallow regions of a reduced depth close to the surface of the substrate, with these shallow regions exhibiting a well-defined dopant concentration and reduced junction depth.

However, the prior art pre-amorphization process as depicted with reference to FIG. 1a is quite troublesome and time-consuming. In fact, heavy ions have to be implanted and the implantation is performed during a time that is long enough to allow crystal damage induced by the implanted ions to accumulate so as to form a continuous amorphous layer. In particular, the long implantation time required results in a negative impact on the productivity and in increased production costs. Moreover, implanting equipment on a large scale is required, which also results in higher production costs.

Accordingly, in view of the problems explained above, it would be desirable to provide a technique that may solve or at least reduce one or more of these problems. In particular, it would be desirable to provide a technique that allows the prevention and/or reduction of ion channeling during halo implantation and source and drain implantation processes.

SUMMARY OF THE INVENTION

In general, the present invention is based on the consideration that ion channeling may be prevented or reduced and a shallow doping profile for optimum transistor design may be obtained by performing a two-step damaging and amorphizing implantation. For example, by performing a first light ion damaging implantation step, a good confinement of the subsequent halo implantation may be obtained. In particular, it has been observed that the crystal damage induced during a first light ion implantation step enables good confinement of the following halo implantation. Moreover, amorphizing the substrate during a subsequent heavy ion implantation may be performed to substantially suppress the channeling, reduce the dopant diffusion and improve the activation layer of the following source/drain and source/drain extension implants. It is, therefore, not necessary to use very high doses (above $10^{14}$ cm$^{-2}$) to fully amorphize the substrate.

According to one embodiment, the present invention relates to a method of amorphizing a crystalline substrate. The method comprises implanting ions of a first dopant material through a surface of the substrate during a first implantation step so as to produce isolated crystal damage into the substrate to a first predefined depth. Moreover, the method comprises implanting ions of a second dopant material through the surface of the substrate during a second implantation step so as to substantially amorphize the substrate to a second predefined depth that is less than said first predefined depth.

According to another embodiment, the present invention relates to a method of forming at least one field effect transistor on a semiconductor substrate. The method comprises forming at least one gate structure above an active region of the transistor and implanting ions of a first dopant material during a first implantation step through the surface of the substrate not covered by the gate structure so as to produce isolated crystal damages into the substrate to a first predefined depth. The method further comprises implanting ions of a second dopant material during a second implantation step through the surface of the substrate not covered by the gate structure so as to substantially amorphize the substrate to a second predefined depth that is less than said first predefined depth.

According to a further embodiment of the present invention, a method of forming at least one field effect transistor on a semiconductor substrate is provided. The method comprises forming at least one polysilicon gate structure above an active region of the transistor and implanting ions of a first dopant material during a first implantation step through the surface of the substrate not covered by the gate structure so as to produce isolated crystal damage into the substrate to a first predefined depth. Moreover, the method comprises implanting ions of a first predefined conductivity type during a second implantation step through the surface of the substrate not covered by the gate structure so as to form halo structures into the portions of the substrate containing the crystal damages, and also comprises implanting ions of a second dopant material during a third implantation step into the halo structures so as to substantially amorphize the substrate to a second predefined depth which is less than the first predefined depth and less than the depth of the halo structures. Furthermore, the method comprises implanting ions of a second predefined conductivity type opposed to the first conductivity type during a fourth implantation step into the amorphized substrate.

According to a further embodiment, the present invention relates to a method of forming at least one active region in a crystalline substrate. The method comprises implanting ions of a first dopant material during a first implantation step through at least one portion of the surface of the substrate so as to produce isolated crystal damage into at least one portion of the substrate to a first predefined depth and implanting ions of a first predefined conductivity type during a second implantation step through the portion of the surface so as to form halo structures into the portion of the substrate containing the damage. The method further comprises implanting ions of a second dopant material during a third implantation step into the halo structures so as to substantially amorphize the substrate to a second predefined depth which is less than the first predefined depth and less than the depth of the halo structures. Moreover, the method comprises implanting ions of a second predefined conductivity type opposed to the first conductivity type during a fourth implantation step into the amorphized substrate.

BRIEF DESCRIPTION OF THE DRAWINGS

The invention may be understood by reference to the following description taken in conjunction with the accompanying drawings, in which like reference numerals identify like elements, and in which.

Figure 1A:
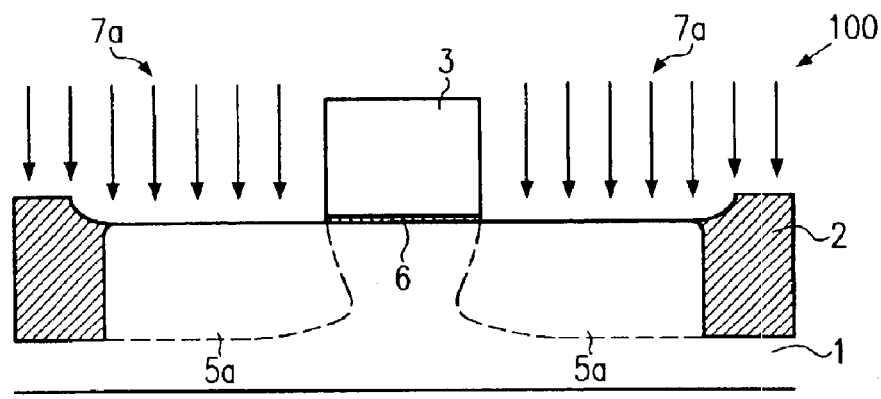
FIGS. 1a–1d represent a typical process sequence of a prior art method of forming the source and drain regions of a field effect transistor comprising the step of implanting heavy ions to amorphize the substrate.
Figure 1B:
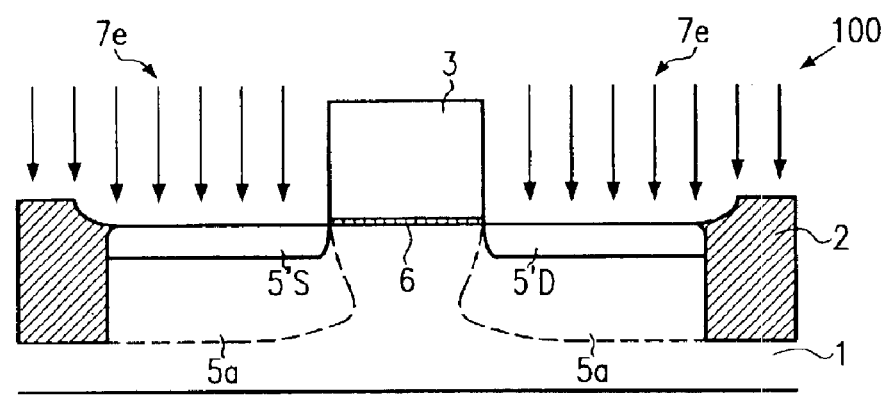
Figure 1C:
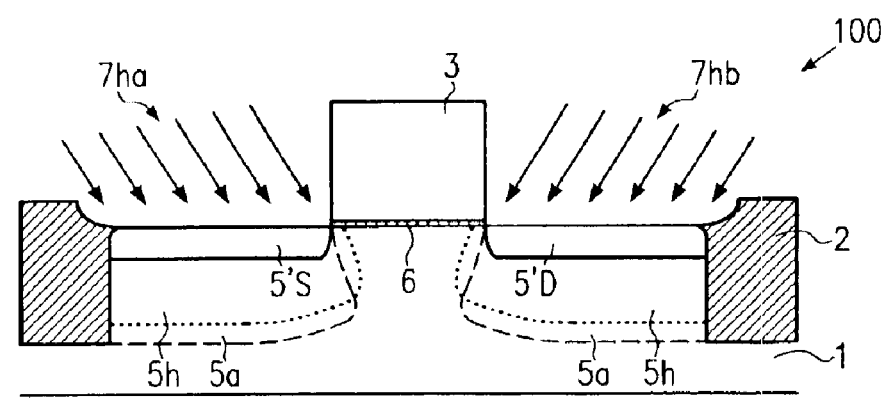
Figure 1D:
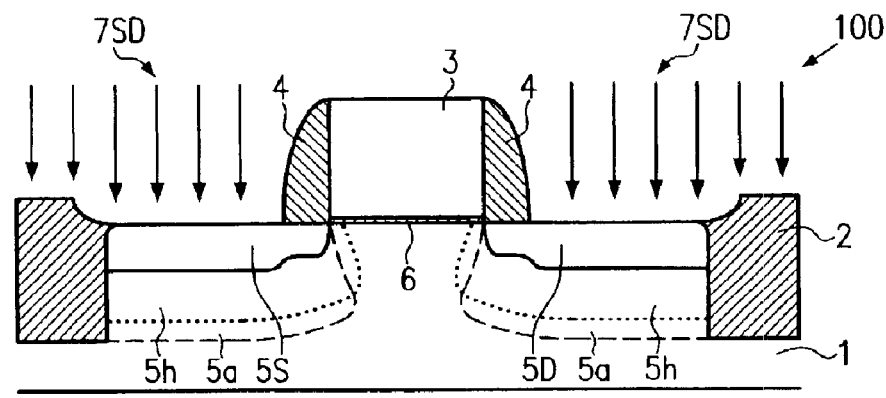

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is understood to be of particular advantage when used for forming the active regions of field effect transistors. For this reason, examples will be given in the following in which corresponding embodiments of the present invention are applied to the formation of the active regions of a field effect transistor. However, it has to be noted that the use of the present invention is not limited to the formation of the active regions of field effect transistors, but rather the present invention can be used in any other situation in which the realization of shallow doping profiles in a substrate and/or a workpiece is required. The present invention can be carried out in all those situations in which it is required to control the ion channeling during ion implantation steps with the purpose of forming well-confined doping profiles exhibiting a reliable dopant-concentration as well as shallow doping profiles. The present invention can be carried out in all those situations in which optimum design of doped regions in a substrate is required. The present invention is therefore applicable in these situations and the source and drain regions of a field effect transistor described in the following illustrative embodiments are to represent any such portion and/or region of a substrate.

Figure 2A:
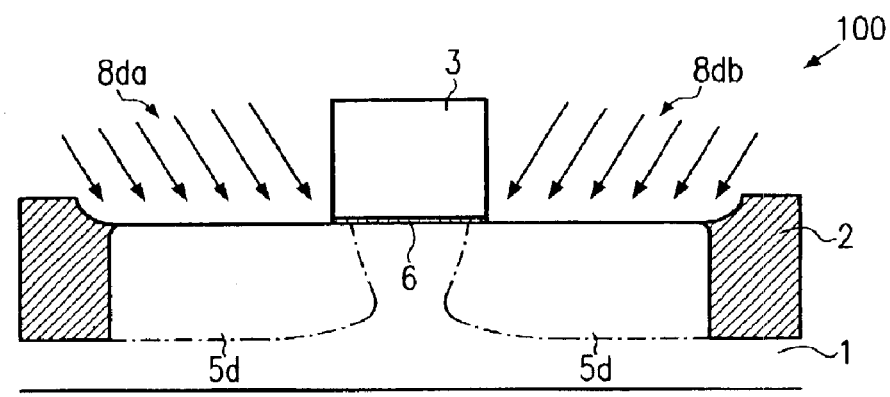
FIGS. 2a–2e represent a process sequence of a method of forming the source and drain regions of a field effect transistor comprising a two-step damaging and amorphizing implantation process according to an illustrative embodiment of the present invention.

With reference to FIGS. 2a–2e, an illustrative embodiment of the two-step damaging and amorphizing method of the present invention will now be described. In FIG. 2a, reference 1 relates to a substrate on which a field effect transistor 100 is to be formed, such as, for example, a PMOS, an NMOS or a CMOS transistor. Reference 2 relates to isolation structures defining an active region of the transistor 100. The isolation structures 2 are provided as shallow trench isolation (STI) structures. However, other isolation structures, for instance LOCOS structures (local oxidation of silicon), could have been formed instead of STI structures. The isolation structures 2 essentially comprise an insulating material, such as silicon dioxide, silicon nitride or the like. Reference 3 relates to a polysilicon gate electrode, in the following also referred to as gate polysilicon line, formed on a gate insulation layer 6 patterned on the active regions of the substrate 1. Moreover, in FIG. 2a, references 8da and 8db relate to corresponding ion beams to which the substrate 1 is exposed for the purpose of implanting dopants through the portions of the surface of the substrate 1 not covered by the polysilicon line 3 and the gate insulation layer 6 so as to damage the crystalline structure of the substrate 1. Finally, in FIG. 2a, reference 5d relates to regions of the substrate 1 in which the crystalline structure of the substrate 1 has been damaged by exposing the substrate to the ion beams 8da and 8db. The regions 5d are not continuous amorphous regions but contain isolated crystal damages and/or not overlapping amorphous regions, as will become more apparent in the following disclosure.

Figure 2B:
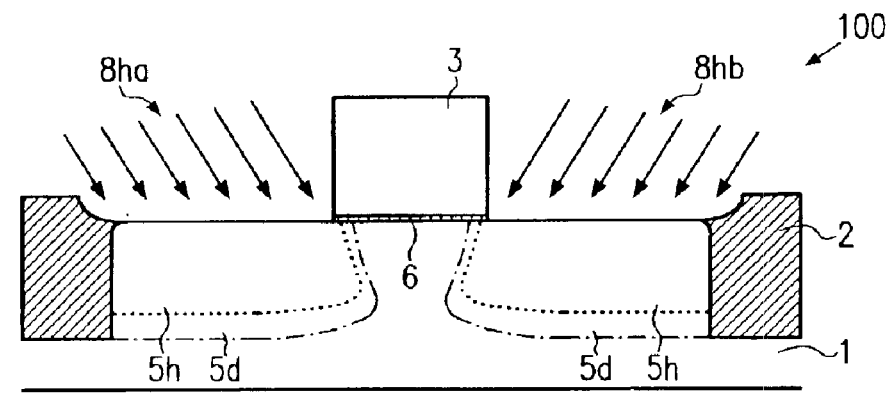

In FIGS. 2b-2e, the features already described with reference to FIG. 2a are identified by the same reference numerals. In FIG. 2b, references 8ha and 8hb relate to ion beams to which the substrate 1 is exposed for the purpose of implanting dopants into the substrate 1 so as to form halo structures into the damaged regions 5d. These halo structures are identified in FIG. 2b by the reference numeral 5h.

Figure 2C:
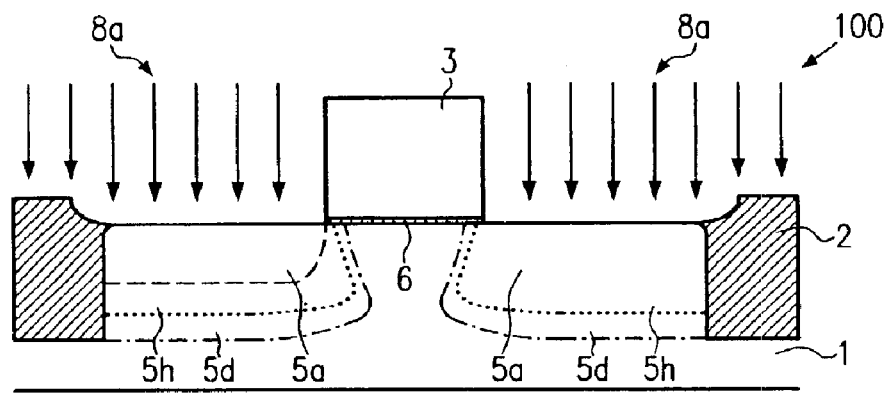

In FIG. 2c, reference 8a identifies an ion beam to which the substrate 1 is exposed for the purpose of forming amorphous regions 5a within the damaged regions 5d. As is apparent from FIG. 2c, the amorphous regions 5a are formed to a depth which is less than the depth of the damaged regions 5d and less than the depth of the halo structures 5h.

Figure 2D:
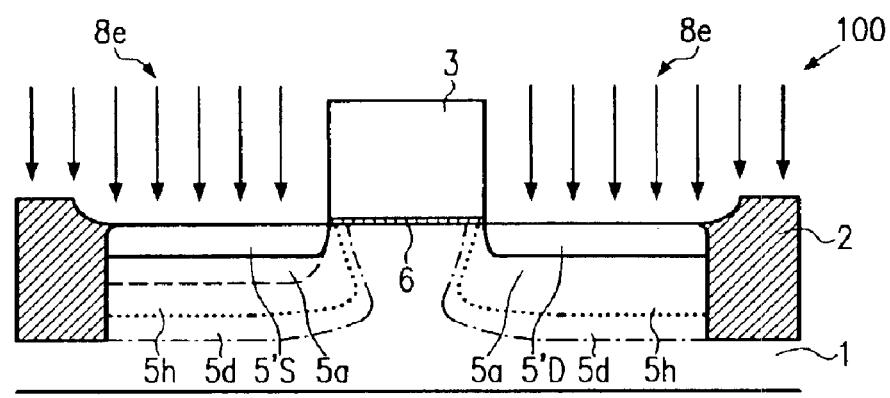

In FIG. 2d, references 5'S and 5'D relate to source and drain extension (SDE) regions formed in the substrate 1. Reference 8e relates to an ion beam to which the substrate 1 is exposed for the purpose of forming the source and drain extension regions 5'S and 5'D. The source and drain extension regions 5'S and 5'D contain a light dose of dopants in the exposed portions of the substrate 1, i.e., in the portions of the substrate not covered by the polysilicon line 3 and the gate insulation layer 6. For instance, in the case of a PMOS transistor, a light dose of a P-type dopant material, e.g., boron, is implanted, while a light dose of an N-type material, e.g., phosphorous, is implanted in the case of an NMOS transistor.

Figure 2E:
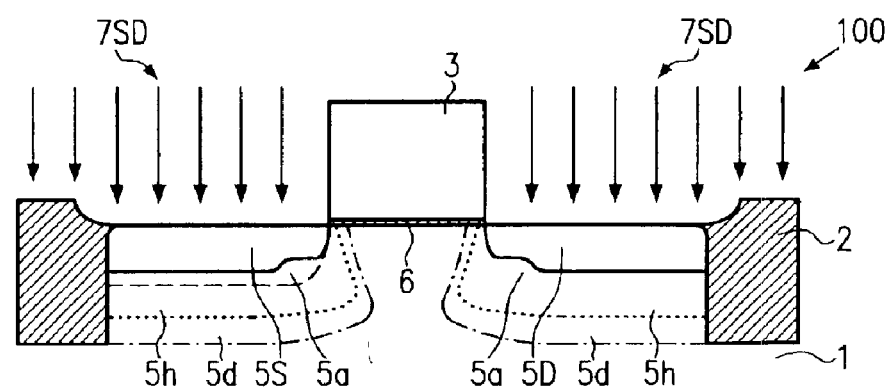

In FIG. 2e, reference 7SD identifies a further ion beam to which the substrate 1 is exposed during a further implantation process for the purpose of forming the source and drain regions of the transistor 100. In particular, in FIG. 2e, these source and drain regions are identified by the reference numbers 5S and 5D, respectively. Usually, a heavy implantation step is carried out for determining the final concentration of the source and drain regions 5S and 5D. For NMOS and PMOS type devices, this heavy implantation step is performed using an N-type and a P-type dopant material, respectively.

The manufacturing process for the formation of the active region of the transistor 100 as depicted in FIG. 2a may include the following steps. As is apparent from FIG. 2a, a polysilicon gate structure, including the polysilicon line 3 and the gate insulation layer 6, has been previously formed according to well-known techniques. The formation of the active regions normally starts after the polysilicon gate structure has been formed. In the following disclosure, it is assumed that the polysilicon gate structure has already been formed and implanting processes are subsequently carried out for the purpose of forming the active regions of the field effect transistor 100.

During a first implanting step according to the present invention, a light ion implantation step is performed for the purpose of implanting ions deep into the silicon substrate so as to induce crystal damages and/or non-overlapping amorphous regions to a predefined depth into the substrate 1. Typical implant elements are silicon or argon at an implant energy higher than 15 keV. It has already been observed that approximately 10% of crystal damage heavily reduces the channeling of subsequently implanted dopants. It is therefore not necessary to use very high doses of dopants (above $10^{14}$ cm$^{-2}$) to fully amorphize the substrate. However, even if the substrate is not fully amorphized during the light ion damaging implantation step, the crystal damages induced allow a good confinement of halo implantation that follows so that shallow halo structures exhibiting an optimum profile tailoring may be realized. The light ion damaging implanting step can be performed at zero degrees tilt angle or at a large tilt angle, as depicted in FIG. 2a, depending on the circumstances. In particular, if the implantation is performed at a large tilt angle as depicted in FIG. 2a, the damaged regions induced, i.e., the regions of the substrate containing the crystal damages induced by the ion implantation, will extend deep beneath the polysilicon gate structure. In contrast, when the implanting process is performed at an approximately zero degrees tilt angle, i.e., by exposing the substrate 1 to an ion beam which is approximately perpendicular to the surface of the substrate, damaged regions substantially aligned with the polysilicon gate structure will be obtained. In the particular example depicted in FIG. 2a, it is assumed that the ion beam is kept at an angle with respect to the surface of the substrate so that damaged regions 5d are formed extending deep beneath the polysilicon gate structure. In the particular case depicted in FIG. 2a, it is assumed that the implanting process comprises two demi-periods, wherein the substrate 1 is rotated 180 degrees about an axis perpendicular to the surface of the substrate at the end of the first demi-period and upon entering the second demi-period. In this case, the substrate 1 is exposed to the same ion beam during the first and second demi-periods, and the ion beams 8da and 8db of FIG. 2a indicate that the substrate has been rotated 180 degrees.

Of course, in those circumstances in which the ion beam is kept at an approximately zero degree tilt angle with respect to the surface of the substrate, the substrate 1 does not need to be rotated 180 degrees and the implanting process does not need to be divided into two demi-periods.

Once the damaged regions 5d have been formed as described above, the manufacturing process is continued to form halo regions into the substrate during the subsequent implantation step as depicted in FIG. 2b. To this end, the substrate 1 is exposed to ion beams 8ha and 8hb. This halo implant is self-aligned with the channel edge and dopants are implanted through those portions of the surface of the substrate 1 not covered by the polysilicon gate structure into the damaged regions 5d. In the same way as for the first implanting step as described with reference to FIG. 2a, during halo implants, the ion beams 8ha and 8hb may be either kept at a large tilt angle with respect to the surface of the substrate or may be kept approximately perpendicular with respect to the surface of the substrate, depending on the circumstances. When the ion beams 8ha and 8hb are kept at an angle (for instance, 30 degrees) with respect to the surface of the substrate, the implanting step is again divided into two parts. During the first part, the substrate is exposed to the ion beam 8ha and a dose corresponding to one-half of the final dose is implanted. Once the first part is completed, the substrate is rotated 180 degrees about an axis perpendicular to the surface of the substrate and exposed to the ion beam 8*hb*. Also, in the case of FIG. 2*b*, the two ion beams 8*ha* and 8*hb* have been depicted for reason of clarity. However, the ion beam 8*hb* during the second part corresponds to the ion beam 8*ha* during the first part, with the only difference being that the substrate 1 is rotated 180 degrees once the first part of the halo implanting step is completed.

In the case in which the ion beam is kept approximately perpendicular to the surface of the substrate, the implanting step does not need to be divided into two segments, but an implanting process comprising a single implanting period can be carried out for the purpose of obtaining the desired final concentration of the halo regions 5*h*. A tilt angle other than zero degrees may be used in those circumstances in which halo regions are needed extending considerably into the channel region of the field effect transistor 100, i.e., well beneath the polysilicon gate structure, and less in the vertical direction. In contrast, in those circumstances in which halo structures are needed extending considerably in the vertical direction and less in the horizontal direction, a perpendicular ion beam is preferred, i.e., an ion beam kept at an approximately zero degree tilt angle.

The halo regions 5*h* prevent or at least reduce the short-channel effects, in particular the punch-through effect, in the transistor 100. The dopant concentration in the regions 5*h* as well as the implant energy and the dopants are selected depending on the type of transistor to be formed on the substrate 1. For instance, boron ions in NMOS and phosphorous ions in PMOS are implanted to form a halo punch-through suppression region in each device. Usually, phosphorous is implanted at 90 keV with a dose of $2 \times 10^{13}$ cm$^{-2}$ at 25 degrees tilt, in two segments, with the substrate rotated 180 degrees between two segments. Similar procedures are used for implanting boron. A thermal treatment such as an annealing step is performed after the halo ion implantation step for diffusing the dopants into the substrate.

Due to the fact that the damaged regions 5*d* have been previously formed, ion channeling during the halo implanting step can be better controlled. That is, implanting the halo dopants into the damaged regions 5*d* results in halo structures 5*h* being formed, exhibiting optimum doping profile tailoring. Moreover, the depth of the halo regions 5*h*, i.e., the extension of the halo regions 5*h* into the substrate can be better predefined and shallow halo structures can be obtained.

During a next implantation step, as depicted in FIG. 2*c*, the exposed portions of the substrate 1, i.e., the portions of the substrate 1 not covered by the polysilicon gate structures, are substantially fully amorphized. To this end, the substrate 1 is exposed to an ion beam 8*a*, resulting in the formation of the amorphous regions 5*a* of FIG. 2*c*. The ion beam 8*a* can be either kept approximately perpendicular or at a tilt angle with respect to the surface of the substrate. In the latter case, the implanting process is divided into two segments, with the substrate being rotated 180 degrees between the two segments.

Usually, heavy inert ions like germanium or xenon are implanted during these amorphizing implanting steps at an implant energy typically below 150 keV. This implant step is used to suppress the channeling, reduce the dopant diffusion and improve the activation level of the following source/drain and source/drain extension implants. As is apparent from FIG. 2*c*, the amorphous regions 5*e* extend vertically into the substrate to a depth that is less than a depth of the damaged regions 5*d* and the halo structures 5*h*. However, these shallow amorphous regions 5*d* may still prevent ion channeling during the subsequent implanting steps so that shallow source and drain regions can be formed.

The manufacturing process is then carried out to complete the transistor 100 according to techniques well known to those skilled in the art. In particular, during a next step, as depicted in FIG. 2*d*, a further ion implantation process is carried out for forming the source/drain extension regions 5'S and 5'D. To this end, a dose of approximately $3 \times 10^{13}$ to $3 \times 10^{14}$ cm$^{-2}$ dopant ions is implanted at low energy (30–50 keV) by exposing the substrate 1 to an ion beam 8*e*. Usually, N-type and P-type dopant materials are used for NMOS and PMOS devices, respectively.

The source and drain regions 5S and 5D of the transistor 100 are then completed during a subsequent step, as depicted in FIG. 2*e*. In particular, dielectric sidewall spacers 4 are formed on the sidewalls of the polysilicon line 3 according to well-known techniques, and a further heavy implantation step is carried out for implanting dopants into those regions of the substrate not covered by the polysilicon line 3 and the sidewall spacers 4. At the end of the heavy implantation step, the source and drain regions 5S and 5D are formed to exhibit a predefined dopant concentration. For NMOS and PMOS type devices, this heavy implantation step is performed using an N-type and a P-type dopant material, respectively. Also, in the case of the implanting steps depicted in FIGS. 2*d* and 2*e* for forming the source and drain extension regions and the source and drain regions, ion channeling is reduced because of the damaged regions 5*d* and the amorphous regions 5*a* previously formed according to the present invention.

Once the source and drain regions 5S and 5D have been formed, the manufacturing process is continued to complete the transistor 100 according to techniques well known to those skilled in the art.

All implant steps as described with reference to FIGS. 2*a*–2*e* can be performed at an approximately zero degree tilt angle or at a large tilt angle. Moreover, the sequence of the implanting steps is not fixed, but may be changed according to the circumstances. For instance, the heavy ion amorphization implanting for realizing the amorphous regions 5*a* may be performed first and the light ion damaging implanting step for forming the damaged regions 5*d* may be performed thereafter.

The advantage of using a two-step damaging and amorphizing implantation process according to the present invention is based on the fact that ion channeling can be reduced without fully amorphizing the substrate during a heavy ion implanting step. This is accomplished by pre-damaging the crystalline substrate during a first light ion implanting step and subsequently amorphizing the substrate to a depth that is less than a depth to which the substrate is damaged.

Damaging the substrate during a light ion implanting process results in the formation of isolated crystal damage and/or non-overlapping amorphous regions, thereby allowing the formation of shallow halo structures. Isolated crystal damages and/or not overlapping amorphous structures are locations and/or relatively small regions where the crystalline structure of the substrate is damaged and/or destroyed, that is, where the substrate atoms are displaced from their lattice site, due to the collisions (both nuclear and electronic) of the implanted ions against the substrate atoms.

The substrate can then be substantially fully amorphized to a reduced depth during a next heavy ion implantation step by inducing isolated damages and/or not overlapping amorphous regions to overlap so as to form a substantially continuous amorphous layer. Forming a continuous amorphous layer may act to reduce ion channeling during the subsequent ion implantation steps for forming the source and drain extension regions and the source and drain regions so that very shallow source and drain extension regions and source and drain regions can be formed exhibiting an optimum doping profile.

In other words, by performing the two-step damaging and amorphizing implantation process according to the present invention, shallow implant profiles may be obtained, but the substrate may not be fully amorphized to a large depth.

The manufacturing process is therefore simplified, the time-consuming prior art amorphizing implanting steps may be avoided, and manufacturing costs can be kept to a minimum.

It should also be noted that the present invention is not limited to the formation of the active regions of a field effect transistor, but can be used in all those cases in which ion channeling during ion implantation steps has to be prevented and the realization of a shallow implanting profile is required. The present invention does not need special equipment to be provided, but can be implemented in any usual manufacturing process without adding costs or complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of amorphizing a crystalline substrate, comprising:
    implanting ions of a first dopant material through a surface of said substrate during a first implantation step so as to produce isolated crystal damage into the substrate to a first predefined depth, wherein during said first implantation step the implanting dose is kept lower than $1 \times 10^{14}/cm^2$; and
    implanting ions of a second dopant material through the surface of said substrate during a second implantation step so as to substantially amorphize the substrate to a second predefined depth which is less than said first predefined depth, wherein during said second implantation step ions of one of germanium and xenon are implanted.

2. The method of claim 1, wherein approximately 10% of the crystal damage is produced.

3. The method of claim 1, wherein the ions of said first dopant material are lighter than those of said second dopant material.

4. The method of claim 1, wherein ions of one of silicon and argon are implanted during said first implantation step.

5. The method of claim 1, wherein during said first implantation step the implanting energy is kept higher than 15 keV.

6. The method of claim 1, wherein during said second implantation step the implanting energy is kept lower than 150 keV.

7. The method of claim 1, wherein during one or both of said first and second implantation steps the substrate is exposed to an ion beam which is kept approximately perpendicular to the surface of said substrate.

8. The method of claim 1, wherein during one or both of said first and second implantation steps the substrate is exposed to an ion beam which is kept at a tilt angle with respect to the surface of said substrate.

9. The method of claim 1, wherein said substrate contains at least one semiconductive material.

10. A method of forming at least one field effect transistor on a semiconductive substrate, the method comprising:
    forming at least one gate structure above an active region of said at least one transistor;
    implanting ions of a first dopant material during a first implantation step through the surface of said substrate not covered by said at least one gate structure so as to produce isolated crystal damages into said substrate to a first predefined depth, wherein approximately 10% of the crystal damage is produced; and
    implanting ions of a second dopant material during a second implantation step through the surface of said substrate not covered by said at latest one gate structure so as to substantially amorphize said substrate to a second predefined depth which is less than said first predefined depth, wherein during said second implantation step ions of one of germanium and xenon are implanted.

11. The method of claim 10, wherein the ions of said first dopant material are lighter than those of said second dopant material.

12. The method of claim 10, wherein ions of one of silicon and argon are implanted during said first implantation step.

13. The method of claim 10, wherein during said first implantation step the implanting energy is kept higher than 15 keV.

14. The method of claim 10, wherein during said first implantation step the implanting dose is kept lower than $1 \times 10^{14}/cm^2$.

15. The method of claim 10, wherein during said second implantation step the implanting energy is kept lower than 150 keV.

16. The method of claim 10, wherein during one or both of said first and second implantation steps said substrate is exposed to an ion beam which is kept approximately perpendicular to the surface of said substrate.

17. The method of claim 10, wherein during one or both of said first and second implantation steps said substrate is exposed to an ion beam which is kept at a tilt angle with respect to the surface of said substrate.

18. The method of claim 10, wherein said substrate contains at least one semiconductive material.

19. The method of claim 17, wherein said field effect transistor is one of an NMOS, a PMOS and a CMOS transistor.

20. A method of forming at least one field effect transistor on a semiconductive substrate, the method comprising:
    forming a least one polysilicon gate structure above an active region of said at least one transistor;
    implanting ions of a first dopant material during a first implantation step through the surface of said substrate not covered by said gate structure so as to produce isolated crystal damages into said substrate to a first predefined depth;
    implanting ions of a first predefined conductivity type during a second implantation step through the surface of said substrate not covered by said gate structure so as to form halo structures into the portions of said substrate containing the crystal damages;

implanting ions of a second dopant material during a third implantation step into said halo structures so as to substantially amorphize said substrate to a second predefined depth which is less than said first predefined depth and less than the depth of said halo structures; and implanting ions of a second predefined conductivity type opposed to said first conductivity type during a fourth implantation step into the amorphized substrate.

21. The method of claim 20, wherein approximately 10% of crystal damages are produced.

22. The method of claim 20, wherein the ions of said first dopant material are lighter than those of said second dopant material.

23. The method of claim 20, wherein ions of one of silicon and argon are implanted during said first implantation step.

24. The method of claim 20, wherein during said first implantation step the implanting energy is kept higher than 15 keV.

25. The method of claim 20, wherein during said first implantation step the implanting dose is kept lower than $1 \times 10^4/cm^2$.

26. The method of claim 20, wherein during said third implantation step ions of one of germanium and xenon are implanted.

27. The method of claim 20, wherein during said third implantation step the implanting energy is kept lower than 150 keV.

28. The method of claim 20, wherein said substrate contains at least one semiconductive material.

29. The method of claim 20, wherein said field effect transistor is one of an NMOS, a PMOS and a CMOS transistor.

30. The method of claim 20, further comprising forming spacer elements adjacent to a portion of the sidewalls of said gate structure and implanting ions of a predefined conductivity type corresponding to one of said first and second conductivity types during a fifth implantation step through at least the portions of the surface not covered by said gate structure and said spacer elements.

31. The method of claim 20, wherein the ions of said first and second conductivity type comprise phosphorous and boron.

32. A method of forming at least one active region in a crystalline substrate, comprising:

implanting ions of a first dopant material during a first implantation step through at least one portion of the surface of said substrate so as to produce isolated crystal damages into at least one portion of said substrate to a predefined depth;

implanting ions of a first predefined conductivity type during a second implantation step through said at least one portion of the surface of said substrate so as to form halo structures into said at least one portion of said substrate containing the damages;

implanting ions of a second dopant material during a third implantation step into said halo structures so as to substantially amorphize said substrate to a second predefined depth which is less than said first predefined depth and less than the depth of said halo structures; and implanting ions of a second predefined conductivity type opposed to said first conductivity type during a fourth implantation step into the amorphized substrate.

33. The method of claim 32, further comprising implanting ions of a predefined conductivity type corresponding to one of said first and second conductivity types during a fifth implantation step through said at least one portion of the surface of said substrate.

34. The method of claim 32, wherein approximately 10% of crystal damages are produced.

35. The method of claim 32, wherein the ions of said first dopant material are lighter than those of said second dopant material.

36. The method of claim 32, wherein ions of one of silicon and argon are implanted during said first implantation step.

37. The method of claim 32, wherein during said first implantation step the implanting energy is kept higher than 15 keV.

38. The method of claim 32, wherein during said first implantation step the implanting dose is kept lower than $1 \times 10^{14}/cm^2$.

39. The method of claim 32, wherein during said third implantation step ions of one of germanium and xenon are implanted.

40. The method of claim 32, wherein during said third implantation step the implanting energy is kept lower than 150 keV.

41. The method of claim 32, wherein said substrate contains at least one semiconductive material.

42. The method of claim 32, wherein said field effect transistor is one of an NMOS, a PMOS and a CMOS transistor.

43. The method of claim 32, wherein the ions of said first and second conductivity type comprise phosphorous and boron.

44. A method of amorphizing a crystalline substrate, comprising:

implanting ions of a first dopant material through a surface of said substrate during a first implantation step so as to produce isolated crystal damage into the substrate to a first predefined depth, wherein approximately 10% of the crystal damage is produced; and implanting ions of a second dopant material through the surface of said substrate during a second implantation step so as to substantially amorphize the substrate to a second predefined depth which is less than said first predefined depth.

45. A method of amorphizing a crystalline substrate, comprising:

implanting ions of a first dopant material through a surface of said substrate during a first implantation step so as to produce isolated crystal damage into the substrate to a first predefined depth, wherein during said first implantation step the implanting dose is kept lower than $1 \times 10^{14}/cm^2$; and implanting ions of a second dopant material through the surface of said substrate during a second implantation step so as to substantially amorphize the substrate to a second predefined depth which is less than said first predefined depth.

46. A method of amorphizing a crystalline substrate, comprising:

implanting ions of a first dopant material through a surface of said substrate during a first implantation step so as to produce isolated crystal damage into the substrate to a first predefined depth; and implanting ions of a second dopant material through the surface of said substrate during a second implantation step so as to substantially amorphize the substrate to a second predefined depth which is less than said first predefined depth, wherein during said second implantation step ions of one of germanium and xenon are implanted.

47. A method of amorphizing a crystalline substrate, comprising:

implanting ions of a first dopant material through a surface of said substrate during a first implantation step so as to produce isolated crystal damage into the substrate to a first predefined depth; and implanting ions of a second dopant material through the surface of said substrate during a second implantation step so as to substantially amorphize the substrate to a second predefined depth which is less than said first predefined depth, wherein during one or both of said first and second implantation steps the substrate is exposed to an ion beam which is kept approximately perpendicular to the surface of said substrate.

48. A method of amorphizing a crystalline substrate, comprising:

implanting ions of a first dopant material through a surface of said substrate during a first implantation step so as to produce isolated crystal damage into the substrate to a first predefined depth; and implanting ions of a second dopant material through the surface of said substrate during a second implantation step so as to substantially amorphize the substrate to a second predefined depth which is less than said first predefined depth, wherein during one or both of said first and second implantation steps the substrate is exposed to an ion beam which is kept at a tilt angle with respect to the surface of said substrate.

49. A method of forming at least one field effect transistor on a semiconductive substrate, the method comprising:

forming at least one gate structure above an active region of said at least one transistor;

implanting ions of a first dopant material during a first implantation step through the surface of said substrate not covered by said at least one gate structure so as to produce isolated crystal damages into said substrate to a first predefined depth, wherein approximately 10% of the crystal damage is produced; and implanting ions of a second dopant material during a second implantation step through the surface of said substrate not covered by said latest one gate structure so as to substantially amorphize said substrate to a second predefined depth which is less than said first predefined depth.

50. A method of forming at least one field effect transistor on a semiconductive substrate, the method comprising:

forming at least one gate structure above an active region of said at least one transistor;

implanting ions of a first dopant material during a first implantation step through the surface of said substrate not covered by said at least one gate structure so as to produce isolated crystal damages into said substrate to a first predefined depth, wherein during said first implantation step the implanting dose is kept lower than $1 \times 10^{14}/cm^2$; and implanting ions of a second dopant material during a second implantation step through the surface of said substrate not covered by said latest one gate structure so as to substantially amorphize said substrate to a second predefined depth which is less than said first predefined depth.

51. A method of forming at least one field effect transistor on a semiconductive substrate, the method comprising:

forming at least one gate structure above an active region of said at least one transistor;

implanting ions of a first dopant material during a first implantation step through the surface of said substrate not covered by said at least one gate structure so as to produce isolated crystal damages into said substrate to a first predefined depth; and implanting ions of a second dopant material during a second implantation step through the surface of said substrate not covered by said latest one gate structure so as to substantially amorphize said substrate to a second predefined depth which is less than said first predefined depth, wherein during said second implantation step ions of one of germanium and xenon are implanted.

52. A method of forming at least one field effect transistor on a semiconductive substrate, the method comprising:

forming at least one gate structure above an active region of said at least one transistor;

implanting ions of a first dopant material during a first implantation step through the surface of said substrate not covered by said at least one gate structure so as to produce isolated crystal damages into said substrate to a first predefined depth; and implanting ions of a second dopant material during a second implantation step through the surface of said substrate not covered by said latest one gate structure so as to substantially amorphize said substrate to a second predefined depth which is less than said first predefined depth, wherein during one or both of said first and second implantation steps said substrate is exposed to an ion beam which is kept approximately perpendicular to the surface of said substrate.

53. A method of forming at least one field effect transistor on a semiconductive substrate, the method comprising:

forming at least one gate structure above an active region of said at least one transistor;

implanting ions of a first dopant material during a first implantation step through the surface of said substrate not covered by said at least one gate structure so as to produce isolated crystal damages into said substrate to a first predefined depth; and implanting ions of a second dopant material during a second implantation step through the surface of said substrate not covered by said latest one gate structure so as to substantially amorphize said substrate to a second predefined depth which is less than said first predefined depth, wherein during one or both of said first and second implantation steps said substrate is exposed to an ion beam which is kept at a tilt angle with respect to the surface of said substrate.

54. A method of amorphizing a crystalline substrate, comprising:

implanting ions of a first dopant material through a surface of said substrate during a first implantation step so as to produce isolated crystal damage into the substrate to a first predefined depth, wherein approximately 10% of the crystal damage is produced; and implanting ions of a second dopant material through the surface of said substrate during a second implantation step so as to substantially amorphize the substrate to a second predefined depth which is less than said first predefined depth, wherein during said second implantation step ions of one of germanium and xenon are implanted.

55. A method of forming at least one field effect transistor on a semiconductive substrate, the method comprising:

forming at least one gate structure above an active region of said at least one transistor;

implanting ions of a first dopant material during a first implantation step through the surface of said substrate not covered by said at least one gate structure so as to produce isolated crystal damages into said substrate to a first predefined depth, wherein during said first implantation step the implanting dose is kept lower than $1\times10^{14}/cm^2$; and implanting ions of a second dopant material during a second implantation step through the surface of said substrate not covered by said at latest one gate structure so as to substantially amorphize said substrate to a second predefined depth which is less than said first predefined depth, wherein during said second implantation step ions of one of germanium and xenon are implanted.

* * * * *

UNITED STATES PATENT AND TRADEMARK OFFICE
CERTIFICATE OF CORRECTION

PATENT NO. : 6,924,216 B2 Page 1 of 1
DATED : August 2, 2005
INVENTOR(S) : Thomas Feudel et al.

It is certified that error appears in the above-identified patent and that said Letters Patent is hereby corrected as shown below:

Column 13,
Line 25, change "$1 \times 10^4$" to -- $1 \times 10^{14}$ --.

Signed and Sealed this

Twentieth Day of September, 2005

JON W. DUDAS
*Director of the United States Patent and Trademark Office*